May 22, 1956 L. E. NORTON 2,747,089

MONOSTABLE OSCILLATOR CONTROL

Filed June 22, 1951

INVENTOR
Lowell E. Norton
BY J. L. Whittaker
ATTORNEY

United States Patent Office 2,747,089

Patented May 22, 1956

2,747,089

MONOSTABLE OSCILLATOR CONTROL

Lowell E. Norton, Princeton, N. J., assignor to Radio Corporation of America, a corporation of Delaware Application June 22, 1951, Serial No. 233,034

The terminal 15 years of the term of the patent to be granted has been disclaimed 5 Claims. (Cl. 250—36)

Figure 1:
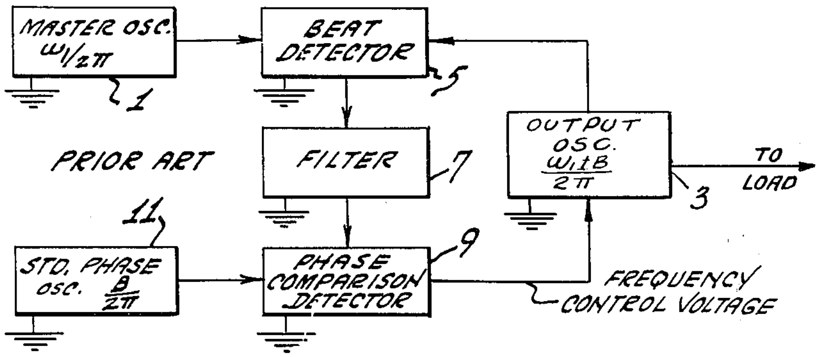

This invention relates generally to frequency control systems and more particularly to means for monostably controlling the signal frequency of a normally bi-stable oscillator.

Heretofore phase lock systems for controlling the signal frequency of oscillators generally have provided ambiguous operating conditions since the operating characteristics of many oscillators afford stable operation at more than one output frequency condition. When, for example, an oscillator is stable at either of two output conditions $$\frac{\omega+B}{2\pi}$$

and $$\frac{\omega-B}{2\pi}$$

(where $\omega$ is a master oscillator signal frequency and B is an offset frequency), it is preferable, and in some instances necessary, to monostably control the signal frequency thereof.

Monostable oscillator control is particularly applicable to microwave frequency stabilization with gas spectral lines. The signal frequency of the above-mentioned output oscillator which, by way of example, may be adjusted to $$\frac{\omega+B}{2\pi}$$

may be utilized as a local oscillator signal to heterodyne with a given frequency signal to provide an intermediate-frequency signal useful in said stabilization.

In present phase-lock frequency control systems it is apparent that an instantaneous deviation in the desired output signal frequency, say an increase in frequency from $$\frac{\omega+B}{2\pi}$$

to $$\frac{\omega+B+\psi}{2\pi}$$

where $\psi$ is a time dependent phase angle, causes a control signal to be produced for correcting the output frequency to the desired value. Since the frequency separation between $$\frac{\omega+B}{2\pi}$$

and $$\frac{\omega-B}{2\pi}$$

is not necessarily great and since the oscillator may be bi-stable, the control signal produced by certain transient frequency shifts may shift the output oscillator signal frequency to the undesired stable condition $$\frac{\omega-B}{2\pi}$$

Obviously, since the output oscillator is incorrectly stabilized, an incorrect intermediate-frequency signal is obtained which is unsatisfactory for spectral line frequency stabilization purposes.

The present invention affords monostable frequency control of bi-stable oscillators by providing a phase lock frequency control system which includes phase shift means for producing frequency control signals indicative of both the magnitude of the instantaneous output signal frequency variation and of the desired one of the aforementioned two stable operating conditions.

An object of the invention is to provide a system for monostably controlling the signal frequency of a normally bi-stable oscillator.

Another object of the invention is to provide an improved phase lock system for monostably controlling the signal frequency of a normally bi-stable oscillator.

A further object of the invention is to provide an improved frequency control system for use with a microwave gas spectral line frequency stabilization system.

According to a typical embodiment of the invention, the signal output from a master oscillator is coincidently applied to a beat detector circuit and to a $$\frac{\pi}{2}$$

phase shift circuit. The phase shift circuit output signal is then applied to a second beat detector. The desired output signal, requiring monostable frequency control thereof, is then simultaneously separately heterodyned with the generated and the phase shifted master oscillator signals. Separate modulation signals derived from the heterodyning are then compared in phase with the phase of a given signal from which comparison control signals are obtained of proper sense to monostably control the frequency of the aforementioned desired output signal.

A second embodiment of the invention is provided wherein the above-mentioned phase shift circuitry is utilized periodically. Since some oscillators are more stable than others, a synchronous switch may be utilized which controls the rate at which control signals are derived for monostable control. Use of the synchronous switch enables the system to operate with a single signal comparison channel and hence substantially simplifies the control circuitry.

Figure 2:
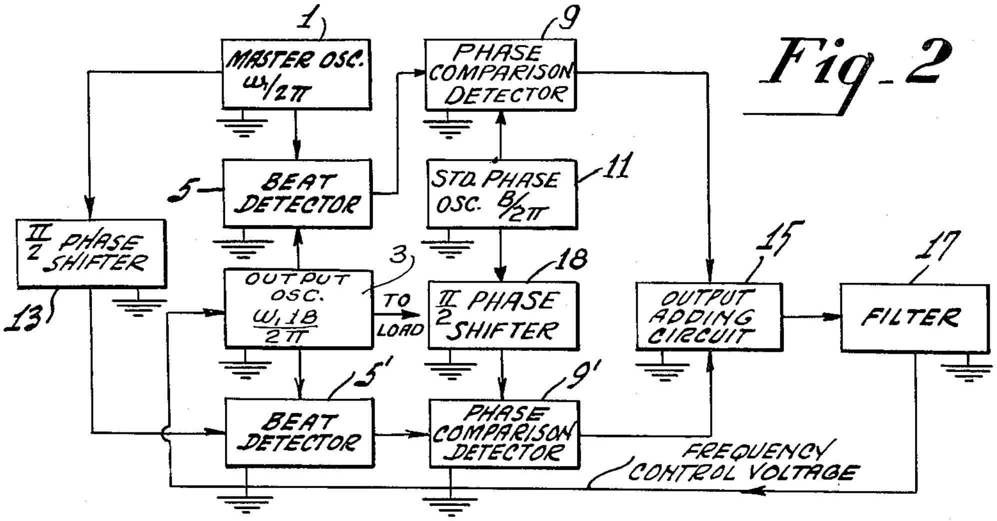
Figure 3:
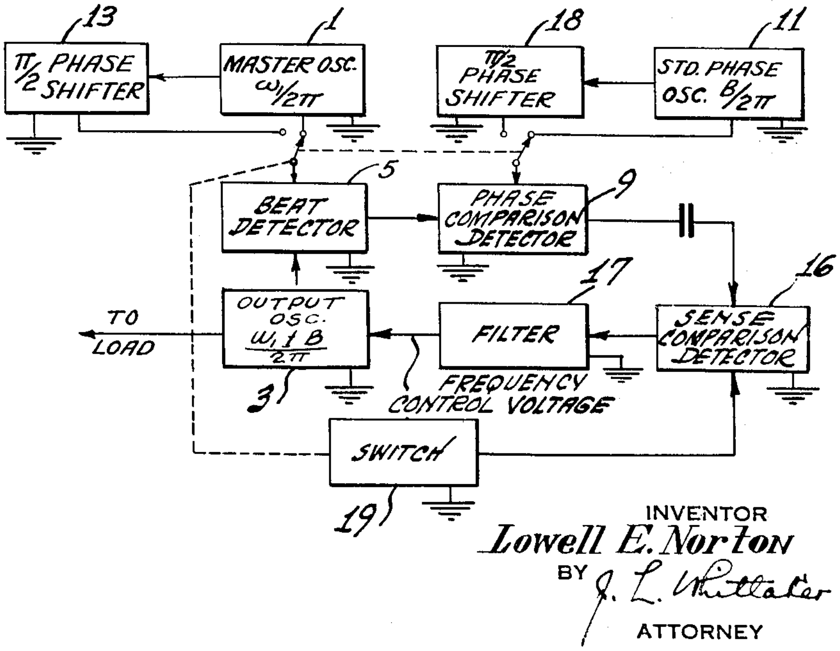

The invention will be described in greater detail with reference to the accompanying drawing in which Figure 1 is a schematic block diagram of a prior art phase lock frequency control system; Figure 2 is a schematic block diagram of a first embodiment of the invention, in which a phase shift circuit is provided for monostably controlling the operating condition of a normally bi-stable oscillator; and Figure 3 is a schematic block diagram of a second embodiment of the invention in which a phase shift circuit is periodically utilized for monostable frequency control purposes.

Like reference characters are applied to like elements throughout the drawing.

Referring to Figure 1 of the drawing, a prior art phase lock frequency control system is illustrated. A brief description of the operation of this conventional system is useful in appreciating the novel features and advantages of the instant invention.

A first (or master) oscillator 1 generates an output signal of frequency $$\frac{\omega_1}{2\pi}$$

A second (or output) oscillator 3 is stable at either of two operating conditions $$\frac{\omega_1+B}{2\pi}$$

and $$\frac{\omega_1-B}{2\pi}$$

The signals generated by these two oscillators 1 and 3 are mixed together in a beat detector 5 from which the difference modulation signal of frequency $$\frac{\omega_1+B}{2\pi}-\frac{\omega_1}{2\pi}=\frac{B}{2\pi}$$

(or alternatively, $$\left.\frac{\omega_1}{2\pi}-\frac{\omega_1-B}{2\pi}=\frac{B}{2\pi}\right)$$

is passed by a filter unit 7 to a phase comparison detector 9 wherein the modulation signal phase is compared with a standard signal of frequency $$\frac{B}{2\pi}$$

which is obtained from a third (or standard phase) oscillator 11. An error, or correction, voltage obtained from the phase comparison, indicative of a deviation in frequency of the output oscillator 3 from the desired frequency (either $$\left.\frac{\omega_1+B}{2\pi} \text{ or } \frac{\omega_1-B}{2\pi}\right)$$

is applied to said oscillator for the frequency control thereof.

Since both of these output conditions are stable, as above shown, the system is unable to distinguish between them and consequently operation may occur at the undesired one of the two conditions for the following reasons.

Assume that the output from the master oscillator is $$e_1=E_1 \sin \omega_1 t \qquad (1)$$

and that the output from the output oscillator is $$e_3=E_3 \sin (\omega_1+B)t \qquad (2)$$

The cross product of $e_1$ and $e_3$, due to the heterodyne action in the beat detector 5, is $$ke_1e_3=\frac{kE_1E_3\cos(\omega_1\pm B-\omega_1)t}{2}-\frac{kE_1E_3\cos(\omega_1\pm B+\omega_1)t}{2}=\frac{kE_1E_3\cos(\pm Bt)}{2}-\frac{kE_1E_3\cos(2\omega_1\pm B)t}{2} \qquad (3)$$

Since only the first term (the difference frequency) is retained by filtering, the useful term is $$e_\mu=\frac{kE_1E_3\cos(\pm Bt)}{2} \qquad (4)$$

It is apparent that $\cos Bt= \cos (-Bt)$ is an identity. Hence the difference frequency signal for a desired output signal frequency of $$\frac{\omega_1+B}{2\pi}$$

is indistinguishable from the difference frequency signal obtained at the second stable condition $$\frac{\omega_1-B}{2\pi}$$

The need then clearly exists in several systems, including the cited example of the spectral line frequency stabilization system, for a phase lock system in which operation may occur at only one signal frequency.

With reference to Figure 2, and according to the invention, the master oscillator 1 again provides an output signal of frequency $$\frac{\omega_1}{2\pi}$$

The output oscillator 3, as before stated, operates at $$\frac{\omega_1\pm B}{2\pi}$$

It should be noted, however, that the master oscillator 1 may be modulated. In either case the output oscillator 3 follows in step with frequency variations of the master oscillator 1 so that the normal frequency displacement is always $$\frac{B}{2\pi}$$

When the output oscillator drifts from its desired operating frequency, the instantaneous output voltage obtained therefrom is $e_3=E_3 \sin [(\omega_1\pm B)t+\psi]$ where $\psi$ is again an arbitrary phase angle which, in general, is a function of time. Since the instantaneous master oscillator output voltage is $e_1=E_1 \sin \omega_1 t$, the difference frequency cross product term derived from applying the two signals $e_1$ and $e_3$ to a beat detector 5 is $$e_5=\frac{kE_1E_3}{2}\cos(\pm Bt+\psi)=kE_1E_3\cos[(Bt\pm\psi)]$$

The potential $e_5$ and a reference potential $e_{11}=E_{11}\cos Bt$, produced by a standard phase oscillator 11, are applied to a phase comparison detector 9 from which the D.-C. component of the detector output is $$e_9=E_9[1+m_1m_2\cos(\pm\psi)]=E_9[1+m_1m_2\cos\psi)] \qquad (5)$$

where $m_1$ and $m_2$ are modulation factors for the potentials $e_5$ and $e_{11}$, respectively.

Coincident with the application of the master oscillator output signal to the beat detector 5, the master oscillator signal is also applied to a $$\frac{\pi}{2}$$

phase shift circuit 13 from which the signal $$e_{13}=E_1\sin\left(\omega_1 t+\frac{\pi}{2}\right)=E_1\cos\omega_1 t$$

is obtained. Heterodyning $e_{13}$ with the output oscillator signal $e_3$ in a second beat detector 5′ produces, by filtering and retaining the difference frequency modulation signal, the signal $$e_5'=kE_1E_3\sin[\pm(Bt)+\psi]=\pm kE_1E_3\sin(Bt\pm\psi)$$

The important result to be observed is that if the desired output oscillator signal frequency is $$\frac{\omega_1+B}{2\pi}$$

then $e_5'=+kE_1E_3\sin(Bt+\psi)$; but, if the desired signal frequency is $$\frac{\omega_1-B}{2\pi}$$

$e_5'=-kE_1E_3\sin(Bt-\psi)$. Hence, $e_5'$ either leads or lags $e_5$ by phase $$\frac{\pi}{2}$$

which lead or lag is dependent upon the sign of the output oscillator signal $$\frac{\omega_1\pm B}{2\pi}$$

The reference potential $e_{11}$ derived from the previously mentioned standard phase oscillator 11, is successively coupled to a second $$\frac{\pi}{2}$$

phase shift circuit 18 and to a second phase comparison detector 9′ wherein its phase is compared with the phase of the second beat detector signal $e_5'$. The D.-C. component of the detector output is then $$e_9' = E_9(1 \pm m_1 m_2 \cos \psi) \qquad (6)$$

where $m_1$ and $m_2$ have the same significance as before and the plus or minus value depends upon whether the output oscillator signal frequency is greater or less than the master oscillator signal frequency.

The variational part of Equation 5 has the same dependence on $\psi$ for either output condition $$\frac{\omega_1 \pm B}{2\pi}$$

The variational part of Equation 6, however, has either a positive or negative cosine dependence on $\psi$, depending upon which of the two output operating frequency conditions $$\frac{\omega_1 \pm B}{2\pi}$$

is selected.

It is this difference in the outputs of the two phase comparison detectors 9 and 9′ which is used to distinguish between the stable output condition $$\frac{\omega_1 + B}{2\pi}$$

and the second stable output condition $$\frac{\omega_1 - B}{2\pi}$$

It is possible to utilize the outputs of the two detectors 9 and 9′ additively for frequency control but this is not preferred since it then becomes necessary to balance out the non-variational term $2E_9$. This follows since the additive output is either $$E_9[1 + m_1 m_2 \cos \psi] + E_9[1 + m_1 m_2 \cos \psi] = 2E_9[1 + m_1 m_2 \cos \psi]$$

for oscillator frequency $$\frac{\omega_1 + B}{2\pi}$$

or $$E_9[1 + m_1 m_2 \cos \psi] + E_9[1 - m_1 m_2 \cos \psi] = 2E_9$$

for frequency $$\frac{\omega_1 - B}{2\pi}$$

In the second case there is no variational voltage and no frequency control. In the first, and operative, case the non-variational term $2E_9$ must be balanced out. For this reason the two detector outputs are combined and added in opposed sense in an output adding circuit 15 from which frequency control signal of either $$e_{15} = 0, \text{ or } e_{15} = 2m_1 m_2 E_9 \cos \psi \qquad (7)$$

for the two frequency conditions $$\frac{\omega_1 + B}{2\pi}$$

and $$\frac{\omega_1 - B}{2\pi}$$

respectively, may be obtained.

Therefore, if the additive connection is used, one of the two possible frequency conditions $$\frac{\omega_1 \pm B}{2\pi}$$

gives a constant voltage output independent of $\psi$ and hence no frequency control, while the other frequency condition gives a control voltage which varies as $\cos \psi$ plus a constant term which serves no useful purpose and, in general, must be balanced out. If the preferred phase opposition connection is used, one of the two possible frequency conditions $$\frac{\omega_1 \pm B}{2\pi}$$

provides zero control voltage independent of $\psi$, while the other frequency condition provides a control voltage proportional to $\cos \psi$. Hence, no matter which connection (additive or subtractive) is chosen, only one of the two frequency conditions $$\frac{\omega_1 \pm B}{2\pi}$$

produces a control voltage and provides frequecy control. Therefore, there is no ambiguity in output frequency. Either frequency $$\frac{\omega_1 \pm B}{2\pi}$$

may be produced by choice of the sense of either of the $\pi/2$ phase shift circuits 13 or 18. Control will occur at either $\psi = \pi/2$ or $$\psi = \frac{3\pi}{2}$$

depending upon the polarity of the control voltage connection. Again, there is no ambiguity because the algebraic sign of the control voltage-phase characteristic at $$\psi = \frac{\pi}{2}$$

has opposite sense to the slope at $$\psi = \frac{3\pi}{2}$$

A filter 17 is provided for removing undesirable modulation product terms and noise prior to the application of the frequency control signal to the output oscillator.

In Figure 3 a switched system is disclosed, according to the invention, for monostably controlling the output oscillator 3 of Figure 2. The signal of frequency $$\frac{\omega_1 \pm B}{2\pi}$$

obtained therefrom is applied to a beat detector 5 wherein, at a predetermined rate $$\frac{\gamma}{2\pi}$$

it is alternately heterodyned with the master oscillator signal $E_1 \sin \omega_1 t$ and the phase shifted master oscillator signal $E_1 \cos \omega_1 t$. The rate of alternation is controlled by a synchronous switch 19 and is dependent upon the operating characteristics of the output oscillator 3. For an oscillator which tends to vary rapidly in frequency a high switching rate is necessary, while a slow frequency drift requires only a moderate switching rate. The signal derived from the beat detector 5 is applied to a phase comparison detector 9 wherein it is compared in phase with a signal of frequency $$\frac{B}{2\pi}$$

generated by a standard phase oscillator 11 for half of the switching cycle due to the synchronous switch 19, and is compared in phase during the second half of the switching cycle with a $\pi/2$ phase shifted signal due to a second $$\frac{\pi}{2}$$

phase shift circuit which is connected to the standard phase oscillator 11. The signal obtained from the phase comparison is then applied to a sense comparison detector 16 for further comparison with a reference potential produced by the switching circuitry. A frequency control signal is therein obtained, filtered and applied to the output oscillator 3 for the monostable control thereof.

If the output signal frequency is $$\frac{\omega_1+B}{2\pi}$$

the square wave output from the beat detector 5 is zero for all values of $\psi$.

If the output signal is at $$\frac{\omega_1-B}{2\pi}$$

the square wave output from beat detector 5 will be zero at $\psi=\pi/2$ and at $$\psi=\frac{3\pi}{2}$$

Taking first the condition centering on $\psi=\pi/2$, when the phase starts to slip between $\psi=\pi/2$ and $\psi=0$ the square wave has one sense, but if the slippage is between $\pi/2$ and $\pi$ the sense is reversed. Hence, the control signal subsequently developed and applied to the oscillator providing the wanted output signal affords stable operation at only one output condition.

For the condition centering on $$\psi=\frac{3\pi}{2}$$

the sense of appearance of a square wave output voltage of one sign or the other with smaller or larger values of $\psi$ than $$\psi=\frac{3\pi}{2}$$

reverses. Therefore, for a particular polarity connection of the frequency control voltage, control will be at either $$\psi=\frac{\pi}{2}$$

or $$\psi=\frac{3\pi}{2}$$

but both are not stable.

Output frequencies at either $$\frac{\omega_1+B}{2\pi}$$

or $$\frac{\omega_1-B}{2\pi}$$

may be selected at will by reversal of the $\pi/2$ phase shift due to the phase shifters 13 and 18.

The comparison detectors herein utilized generally may be of any type but a preferred one is described in my copending application Serial No. 228,921, filed May 29, 1951 now Patent No. 2,683,218 issued July 6, 1954. The synchronous switch 19, above cited, may be any suitable double pole, double throw switch. At microwave frequencies a switch which may be desirable is shown and described by D. K. Bishop in the Wireless Engineer, vol. XXIV, No. 282, pp. 67–70 (1947).

In summation it may be seen that the herein disclosed invention provides monostable frequency control of a normally bi-stable oscillator in that frequency control signals derived according to the invention are sensitive to the desired one of the two stable operating conditions.

The system recited with reference to the circuitry of Figure 3 is particularly desirable when the rate at which the output signal frequency is inspected is moderate since only one beat detector and one phase comparison detector are required. A further advantage of the switched system is that no potential unbalance occurs in using a single signal comparison channel. In the event that the switching rate $$\frac{\gamma}{2\pi}$$

is too high for the switched system to function satisfactorily, the circuitry disclosed with reference to Figure 2 may be employed.

What is claimed is:

1. A system for monostably controlling the frequency of a normally bi-stable oscillator comprising, a first oscillator for providing an output at frequency $$\frac{\omega}{2\pi}$$

a second and normally bi-stable oscillator for providing an output at frequency $$\frac{\omega\pm B}{2\pi}$$

first and second beat detectors, means for applying portions of the outputs of said first and second oscillators to said first beat detector, a 90° phase shifter, means for applying another portion of the output of said first oscillator to said phase shifter, means for applying the output of said phase shifter and another portion of the output of said second oscillator to said second beat detector, a first phase comparison circuit coupled to said first beat detector to receive the output of said first beat detector, a second phase comparison circuit coupled to said second beat detector to receive the output of said second beat detector, a third oscillator providing an output at frequency $$\frac{B}{2\pi}$$

means for applying the output of said third oscillator to said first and second phase comparison circuits, means for combining the outputs of said first and second phase comparison circuits to produce a frequency control signal, and means for applying said frequency control signal to said second oscillator to monostably control its frequency.

2. A system as claimed in claim 1 including a second 90° phase shifter connected between said third oscillator and said second phase comparison circuit.

3. A system for monostably controlling the frequency of a normally bi-stable oscillator comprising, a first oscillator for providing an output at frequency $$\frac{\omega}{2\pi}$$

a beat detector, a 90° phase shifter, means including a switch for alternately applying the output of said first oscillator in one instance directly to said beat detector and in another instance through said phase shifter to said beat detector, a second and normally bi-stable oscillator providing an output at frequency $$\frac{\omega\pm B}{2\pi}$$

means for applying the output of said second oscillator to said beat detector, a comparison circuit, a third oscillator providing an output at frequency $$\frac{B}{2\pi}$$

means for applying the outputs of said beat detector and said third oscillator to said comparison circuit to produce a frequency control signal, and means for applying said frequency control signal to said second oscillator to monostably control its frequency.

4. A system as claimed in claim 3 wherein said comparison circuit comprises a phase comparison circuit.

5. A system as claimed in claim 3 including a second

90° phase shifter, said switch means including means for applying the output of said third oscillator in one instance directly to said comparison circuit and in another instance through said second phase shifter to said comparison circuit.

References Cited in the file of this patent

UNITED STATES PATENTS

| | | |
|---|---|---|
| 2,474,354 | Guanella | June 28, 1949 |
| 2,522,371 | Guanella et al. | Sept. 12, 1950 |
| 2,540,333 | Hugenholtz | Feb. 6, 1951 |
| 2,543,058 | Ranger | Feb. 27, 1951 |